United States Patent [19]

Baldock et al.

[11] 4,335,349
[45] Jun. 15, 1982

[54] SIMULATED OHMS GENERATION METHOD AND APPARATUS FOR CALIBRATING RESISTANCE TYPE MEASURING INSTRUMENTS

[75] Inventors: K. Paul Baldock, Marysville; J. Craig Smith, Jr., Everett, both of Wash.

[73] Assignee: John Fluke Mfg. Co., Inc., Mountlake Terrace, Wash.

[21] Appl. No.: 156,569

[22] Filed: Jun. 5, 1980

[51] Int. Cl.³ ............................................. G01R 27/02
[52] U.S. Cl. ......................................... 324/62; 324/74
[58] Field of Search .............................. 324/62, 63, 74

[56] References Cited

U.S. PATENT DOCUMENTS 2,452,614  11/1948  Teetsell ................................. 324/74
4,104,578  8/1978  Thuot ................................ 324/62 X
4,200,933  4/1980  Nickel et al. ...................... 324/74 X Primary Examiner—Stanley T. Krawczewicz
Attorney, Agent, or Firm—Christensen, O'Connor, Johnson & Kindness

[57] ABSTRACT

A simulated ohms generating method and apparatus for calibrating electrical measuring instruments of the resistance and/or conductance measuring type are disclosed. First, the nature (current or voltage) of the internal power supply of the measuring instrument is determined by sequentially connecting two different resistors to the terminals of the instrument and determining if the current flow through the resistors changes (voltage source) or remains constant (current source). Depending upon the nature of the power supply one or the other of two sequences of steps are followed. While the sequences are somewhat different, they both include adjusting the output of a voltage source connected in series with a fixed resistor and applying the combination to the instrument to simulate a predetermined resistance (ohms) value. After this value is set, the instrument being calibrated is read to determine if the reading is the same as the predetermined resistance value being simulated. If not, the reading is slewed by steps toward the predetermined resistance value by changing the output of the voltage source. When the resistance reading has been slewed to the point where it is the same as the predetermined resistance value, calibration error is determined based on the predetermined resistance value and the simulated resistance value required to achieve a reading equal to the predetermined resistance value.

25 Claims, 8 Drawing Figures and/or the conductance value calculated from the first dummy resistance value. Thereafter, the voltage source is changed by an amount related to the difference between the first dummy resistance and the desired resistance (or the difference between the conductance value calculated from the first dummy resistance value and the desired conductance value). Then, as before, the voltage drops across the input of the measuring instrument and across the fixed resistor are measured and a second dummy resistance value and/or conductance value calculated. These steps are iterated until the measuring instrument reading is the same as the dummy resistance (or conductance) value, at which point the calibration error is determined by subtracting the dummy resistance (or conductance) value from the desired resistance (or conductance) value.

SIMULATED OHMS GENERATION METHOD AND APPARATUS FOR CALIBRATING RESISTANCE TYPE MEASURING INSTRUMENTS

TECHNICAL AREA

This invention relates to methods and apparatus for calibrating electronic measuring instruments and, in particular, methods and apparatus for calibrating measuring instruments of the resistance and/or conductance measuring type.

BACKGROUND OF THE INVENTION

The classical way of calibrating instruments for measuring resistance and/or conductance has been to connect a precision resistor of known value across the input terminals of the measuring instrument, read the instrument and record the difference (e.g., error) between the reading and the known value of the precision resistor. Several such calibration sequences are performed over the range of impedances that can be measured by the measuring instrument; and, the results are used to form a table or graph. Thereafter, when the measuring instrument is used to measure the value of an unknown resistance, the reading is corrected using the calibration error displayed on the table or the graph. Measurement errors lying between the points where calibration errors are determined, of course, require the use of interpolation techniques.

The foregoing method of calibrating resistance and conductance measuring instruments has a number of disadvantages. First, the foregoing sequence is time consuming and, therefore, expensive. Further, it must be carried out by skilled electronic technicians. Also, while precision resistors are relatively accurate when compared with nonprecision resistors, their resistance values are not precisely exact, i.e., their resistance values fall within some (albeit small) tolerance range. Moreover, the resistance values of even precision resistors vary with temperature and age. As a result, the precision resistors used for calibration purposes must themselves be checked for accuracy. Checking the calibrating resistors is, of course, also time consuming and, therefore, costly. Moreover, because of instrument component aging, deterioration and the like, resistance/conductance measuring instruments must be frequently recalibrated in order for their associated error tables or graphs to be relied on to produce accurate results. Regular recalibration is equally time consuming and, therefore, also costly. Finally, the accuracy of error tables or graphs is directly related to the number of error points or values determined during calibration. If a small number of calibration error values are determined, the ranges over which interpolation is required will be relatively wide. Because interpolation is usually performed in a linear manner whereas errors are frequently nonlinear (and often random), the width of the interpolation regions is often directly related to the inaccuracy remaining in "corrected" measurements. Therefore, there is a need for a method and apparatus for rapidly and automatically determining the calibration error of resistance/conductance measuring instruments. It is a general object of this invention to provide such a method and apparatus.

That is, it is an object of this invention to provide a method and apparatus for rapidly and automatically calibrating resistance and/or conductance measuring instruments.

It is another object of this invention to provide a method and apparatus for determining the calibration error of resistance and/or conductance measuring instruments that does not involve the use of highly precise resistors during a time consuming series of calibration sequences.

It is a further object of this invention to provide an apparatus for calibrating resistance and/or conductance type measuring instruments that is rapid and easy to use, particularly by nonhighly skilled personnel.

SUMMARY OF THE INVENTION

In accordance with this invention, a simulated ohms generation method and apparatus for calibrating measuring instruments of the resistance and/or conductance measuring type is provided. In general, the method comprises the steps of: determining the current or voltage nature of the internal power supply of the measuring instrument to be calibrated; adjusting the output of a voltage source connected in series with a fixed resistor so that the combination simulates a predetermined resistance value; changing the value of the voltage source so that the measuring instrument reading is slewed toward the predetermined resistance value; and, determining the calibration error when the measuring instrument reading is the same as the predetermined resistance value.

Preferably, the step of determining the current or voltage nature of the internal power supply of the measuring instrument is determined by sequentially connecting two different resistors to the terminals of the measuring instrument and determining if the current flow through the resistors changes or remains constant. If the current flow changes, of course, the internal power supply is a voltage source power supply. Contrariwise, if the current remains constant, the internal power supply is a current source power supply.

Further, preferably, the step of adjusting the output of the voltage source connected in series with the fixed resistor so that the combination simulates a predetermined resistance value includes one or the other of two sequences of substeps. Which sequence of substeps is followed is determined by the nature of the power supply. More specifically, if the power supply is a voltage source power supply, the value of the input resistance of the measuring instrument is first determined. Thereafter, the actual value of the voltage source power supply of the measuring instrument is determined. Then, the value of the voltage to be connected in series with the fixed resistor to create the desired simulated ohms value is determined. Finally, the output of the voltage source is set to produce the determined voltage, whereby the desired ohms value is simulated. Alternatively, if the internal power supply of the measuring instrument is determined to be a current source power supply, the value of the voltage source to be connected in series with the fixed resistor to simulate the desired ohms value is immediately determined and the output of the voltage source set to this value, whereby the desired ohms value is simulated.

Regardless of which of the sequences is followed to this point, thereafter, preferably, both sequences determine the value of a first dummy resistance based on the measured values of the voltage drop across the input of the measuring instrument, the voltage drop across the fixed resistor and the known value of the fixed resistor (which is not necessarily a precise resistor). Next, the first dummy resistance is compared to the predetermined resistance to determine if the error therebetween is greater or less than the tolerance of the measuring instrument to be calibrated. If the error is greater than the tolerance of the measuring instrument being calibrated, the resistance value to be simulated is redetermined; and, the output of the voltage source redetermined and changed accordingly. This sequence of operation is repeated until the error between the first dummy resistance value and the predetermined resistance is such that the error therebetween is no longer greater than the tolerance of the measuring instrument being calibrated. Thereafter, calibration error is determined. Preferably, calibration error is determined by allowing a test operator to change the value of the voltage source in large or small steps, upwardly or downwardly, until the reading of the measuring instrument to be calibrated is equal to the initial value of the predetermined resistance. Then, a second dummy resistance is determined, and used to determine the calibration error.

The preferred form of an apparatus formed in accordance with the invention includes: a controller; an interface; a voltage measuring instrument; and, a controllable voltage source. The voltage measuring instrument and the controllable voltage source are connected to the interface, which includes a series of resistors and a plurality of switches controlled by the controller. Further, the controllable voltage source is connected by the controller to be controlled thereby; and, the voltage measuring instrument is connected to the controller to supply signals thereto that denote the voltage measured by the voltage measuring instrument. Finally, the interface is adapted for connection to the resistance and/or conductance measuring instrument to be calibrated. In operation, the controller automatically controls the position of the switches of the interface such that suitable resistors are first connected to the measuring instrument to be calibrated in order to determine whether the internal power supply of the measuring instrument is a voltage source or a current source power supple. The voltage measuring instrument, of course, is connected to measure the voltage drop across the resistors in order to develop the data needed to make this determination. Thereafter, the output of the controllable voltage source is connected in series with one of the resistors forming part of the interface and the series circuit is connected across the measuring instrument to simulate a predetermined ohms value, as discussed above. Thereafter, the controller receives data from the voltage measuring instrument and controls the output of the controllable voltage source in the manner previously described such that the sequence of steps previously described occurs. The controller, of course, performs the mathematical determinations necessary to carry out the steps in the desired sequence.

It will be appreciated from the foregoing brief description that the invention provides a new and improved method and apparatus for calibrating measuring instruments. The measuring instrument can be a simple resistance meter or a complex multimeter that makes measurements based on conductance as well as resistance principles, or lie somewhere inbetween. Because the output of a voltage source is connected in series with a resistor to simulate a desired resistance value, a large number of resistors are not required. Moreover, the resistors utilized do not have to be precise since the output of the controllable voltage source can be varied to compensate for any difference between the actual value of a resistor and its nominally known value. Thus, while the value of a few resistors must be accurately known, those resistors do not have to have precise values. Further, because apparatus formed in accordance with the invention includes an automatic sequencing controller, calibration is rapid, can be performed by minimally skilled electronic technicians and, thus, is relatively low in cost. Moreover, the invention is ideally suited for providing a large number of calibration points to reduce the amount of interpolation, whereby errors resulting from relatively inaccurate tables or graphs created by a relatively few number of calibration points are avoided.

BRIEF DESCRIPTION OF THE DRAWINGS

The foregoing object and many of the attendant advantages of this invention will become more readily appreciated as the same becomes better understood by reference to the following detailed description when taken in conjunction with the accompanying drawings wherein.

DESCRIPTION OF THE PREFERRED EMBODIMENT

As is well known to those skilled in the measuring and testing art, certain electronic measuring instruments measure the resistance or conductance value of an unknown impedance by passing a current through the impedance and measuring the voltage drop across the impedance, or by applying a voltage to the impedance and measuring the current drawn by the impedance. Prior to the present invention calibration of such instruments has usually been accomplished by connecting a series of resistors of known value across the measuring instrument and recording the reading of the instrument for each resistance. The relationship between the known value of the calibrating precision resistances and the instrument readings provides data suitable for display in graphical or tabular form. This data is later utilized when the measuring instrument is used to measure the resistance or conductance of an unknown impedance to correct the instrument reading.

Figure 1:
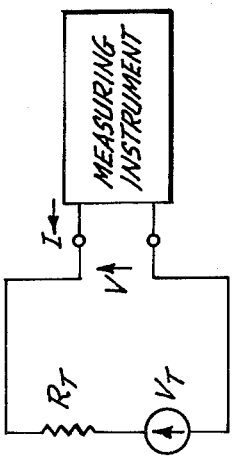
FIG. 1 is a simplified schematic diagram illustrating the generation of a simulated ohms value in accordance with the invention.

The present invention is directed to a method and apparatus for calibrating resistance and/or conductance measuring instruments but in a somewhat different manner. Specifically, rather than connecting precision resistors to the measuring instrument during calibration, the invention simulates the value of such resistors. Simulation is accomplished by controlling the output of a controllable voltage source connected in series with a fixed resistor across the terminals of the measuring instrument to be calibrated. More specifically, as illustrated in FIG. 1, a variable voltage, $V_T$, is connected in series with a fixed resistor, $R_T$, across the input of a measuring instrument. This arrangement makes the measuring instrument believe that it is seeing some value of resistance other than the value of $R_T$. In this manner any desired resistance value can be simulated to an accuracy substantially better than the accuracy of most precision resistors. Moreover, the need for expensive precision resistors is entirely eliminated.

As noted above, resistance/capacitance measuring instruments have one or the other of two different types of internal power supplies—current source or voltage source power supplies. In many instances the calibrating technician knows what type of power supply is contained in a particular instrument. In other cases the calibrating technician does not know this information. While power supply type information can be gained from technical manuals and the like, developing such information is often time consuming and, therefore, undesirable. The present invention does not require that this information be known or developed in such a manner.

Figure 3:
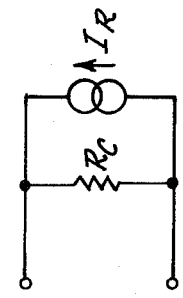
FIG. 3 is a simplified schematic diagram illustrating a current source power supply.
Figure 2:
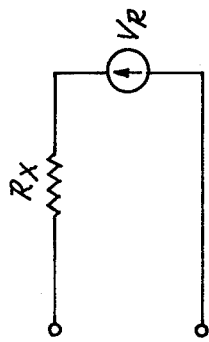
FIG. 2 is a simplified schematic diagram illustrating a voltage source power supply.

FIG. 2 is a simplified schematic diagram of a voltage source power supply and includes a voltage source designated $V_R$ having a series input resistance designated $R_X$. FIG. 3 is a simplified schematic diagram of a current source power supply and includes a source of constant current denoted $I_R$ having a parallel input resistance denoted $R_C$. In order for the invention to simulate a desired value of resistance it is necessary to determine whether the power supply of the measuring instrument to be calibrated is a voltage source power supply (FIG. 2) or a current source power supply (FIG. 3). In accordance with the invention this is accomplished by sequentially connecting two resistors of different value across the terminals of the measuring instrument. If the current flow through the two resistors remains the same, the power supply is established to be a current source power supply. Contrariwise, if the current flow through the resistors changes, the power supply is considered to be a voltage source power supply. After the nature of the power supply is determined, a variable voltage is connected in series with a chosen resistor and utilized to calibrate the measuring instrument.

Figure 4:
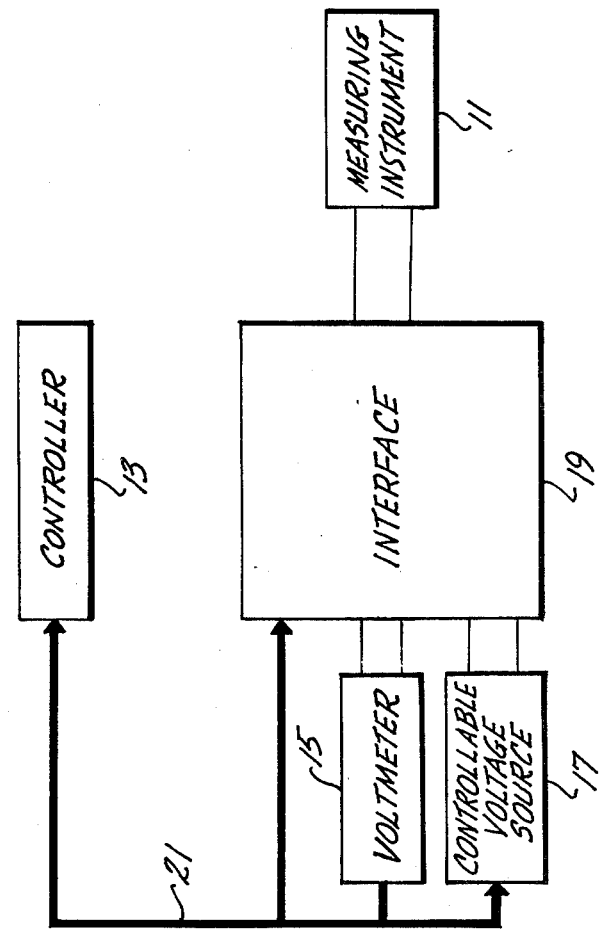
FIG. 4 is a block diagram of a simulated ohms generation system for calibrating measuring instruments, formed in accordance with the invention.

FIG. 4 is a block diagram of a simulated ohms calibration system formed in accordance with the invention for calibrating a resistance and/or conductance measuring instrument 11. The simulated ohms calibration system illustrated in FIG. 4 includes: a controller 13; a voltage measuring instrument (i.e., a voltmeter) 15; a controllable voltage source 17; and, an interface 19. Preferably, the controller 13 is a digital controller, and, the voltmeter 15 is a digital voltmeter that produces a digital output signal representing the value of the analog voltage being measured. Also, preferably, the controllable power supply 17 is controlled by digital control signals. Further, preferably, the interface 19 includes a plurality of digitally controlled switches and a plurality of resistors. In the preferred digital version of the invention, the controller 13 is connected to the voltmeter 15, the controllable voltage source 17 and the interface 19 by a parallel digital data bus 21. The parallel digital data bus 21 allows the controller 13 to apply voltage control signals to the controllable voltage source 17 and switch control signals to the switches of the interface 19. In addition, the parallel digital data bus allows the controller 13 to receive digital voltage signals from the voltmeter 15. In addition to being connected to the parallel digital data bus 21 to receive switch control signals from the controller 13, the interface 19 is connected to the measuring instrument 11, the voltmeter 15 and the controllable voltage source 17.

Figure 5:
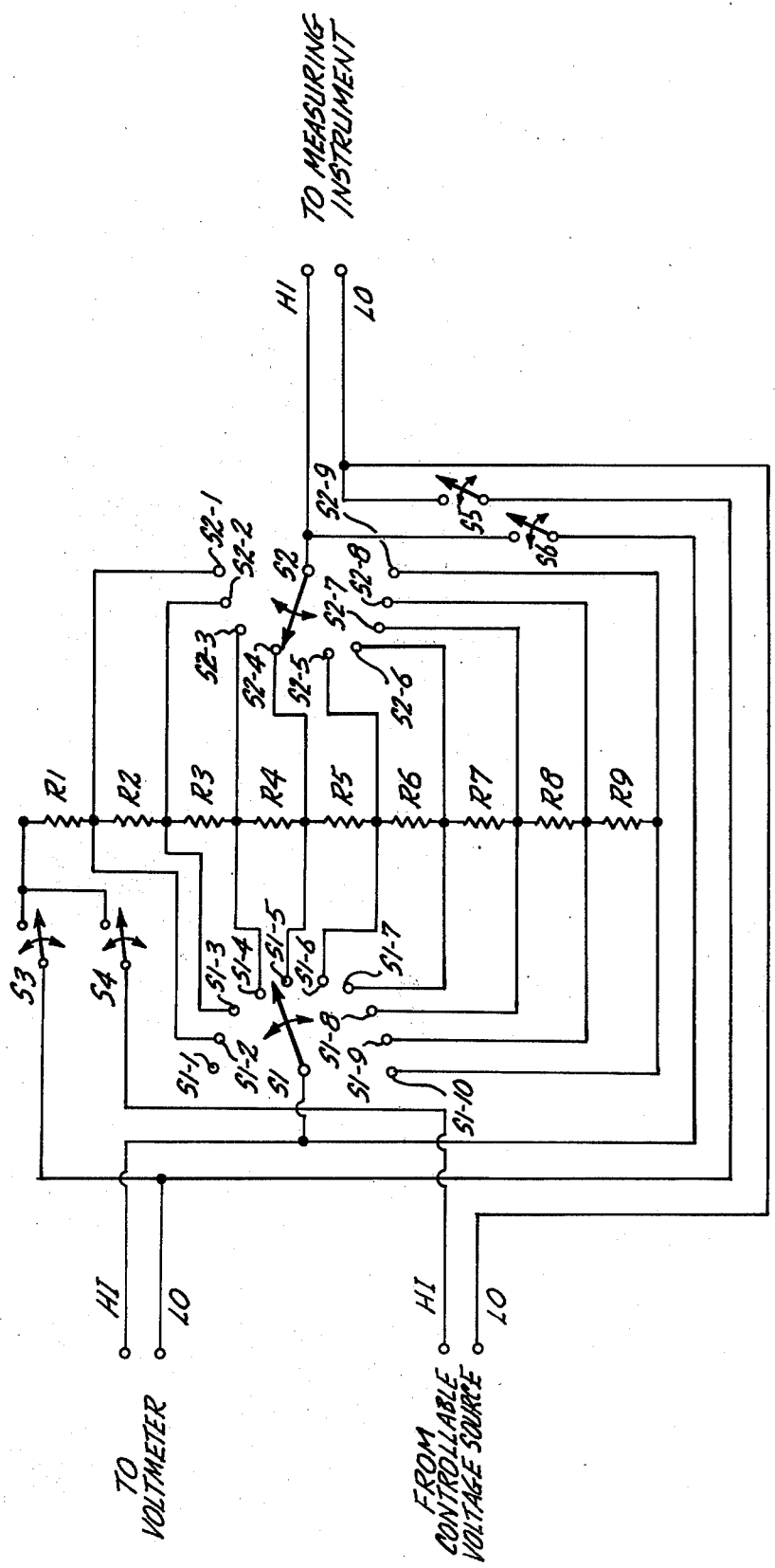
FIG. 5 is a schematic diagram of an interface suitable for use in the simulated ohms generation system illustrated in FIG. 4; and, FIGS. 6A, 6B and 6C form a composite flow diagram illustrating the operation of the controller illustrated in FIG. 4.

FIG. 5 is a schematic diagram of an interface suitable for use in the simulated ohms calibration system illustrated in FIG. 4 and comprises: a single pole, ten position switch designated S1; a single pole, nine position switch designated S2; four single pole, single throw switches designated S3–S6; and, nine resistors designated R1 through R9. The ten remote terminals of S1 are designated S1-1 through S1-10 and the nine remote terminals of S2 are designated S2-1 through S2-9. For ease of illustration and description, the switches are illustrated in FIG. 5 as simple mechanical switches. However, it should be understood that in an actual embodiment of the invention, preferably, the switches would take the form of relay switches controllable by appropriate digital control signals, rather than mechanically operated switches.

R1 through R9 are connected in series in numerical order. The outer end of R1 (i.e., the end remote from the junction or node between R1 and R2) is connected to one terminal of S3 and one terminal of S4. The other terminal of S3 is connected to the low input terminal of the voltmeter 15 and to one terminal of S5. The other terminal of S5 is connected to the low input terminal of the measuring instrument 11. The other terminal of S4 is connected to the high output terminal of the controllable voltage source 17. S1-1 is unconnected. The node between R1 and R2 is connected to S1-2 and to S2-1. The node between R2 and R3 is connected to S1-3 and to S2-2. The node between R3 and R4 is connected to S1-4 and to S2-3. The node between R4 and R5 is connected to S1-5 and to S2-4; and, the node between R5 and R6 is connected to S1-6 and S2-5. The node between R6 and R7 is connected to S1-7 and to S2-6. The node between R7 and R8 is connected to S1-8 and to S2-7; and, the node between R8 and R9 is connected to S1-9 and to S2-8. Finally, the end of R9 remote from the node between R8 and R9 is connected to S1-10 and to S2-9. The common terminal of S1 is connected to the high input terminal of the voltmeter 15. The common terminal of S1 is also connected to one terminal of S6. The other terminal of S6 is connected to the common terminal of S2 and to the high input terminal of the measuring instrument 11. Finally, the low output terminal of the controllable voltage source 17 is connected to the low input terminal of the measuring instrument 11.

As previously discussed, prior to actually calibrating a measuring instrument, it is necessary to determine the nature (current or voltage) of the power supply of the measuring instrument. This is accomplished by sequentially connecting two different resistance values across the input (high and low) terminals of the measuring instrument, measuring the voltage drop across the resistances, converting the voltage drop data into current flow data and comparing the current flow data. The interface illustrated in FIG. 5 provides the required circuit paths that allows the necessary data to be accumulated by the controller. In this regard, during the power supply type determining steps S4 is maintained open so that the controllable voltage source is maintained disconnected. S3 and S5 are closed to connect the remote end of R1 to the low input terminal of the voltmeter and to the low input terminal of the measuring instrument. Thereafter, S2 is controlled so as to connect the other end of the desired resistance value, formed by the series connected R1, R2, etc., to the high input terminal of the measuring instrument. The voltage drop across the chosen series of resistors is determined by connecting S1 to the same resistor pair node that S2 is connected to. For example, if the chosen series of resistors to be connected across the input terminals of the measuring instrument comprises R1 through R4, the common terminal of S2 is connected to S2-4. The voltage drop across R1 through R4 is measured by connecting the common terminal of S1 to S1-5. In this way, the common terminals of both S1 and S2 are connected to the node between R4 and R5. Because S3 is closed, the voltage drop across R1 through R4 is connected to the voltmeter and measured. If the second resistance value is chosen to be R1 through R3, whereby the common terminal of S2 is connected to S2-3, then, of course, S1 is switched so that the common terminal of S1 is connected to S1-4 so that the voltage drop across R1-R3 is applied to the voltmeter and measured.

As will be better understood from the following detailed description of the operation of the controller 13, after the nature (current or voltage) of the power supply of the measuring instrument has been determined, the calibration sequence begins. At certain points in the calibration sequence it is necessary to measure the voltage drop across the input terminals of the measuring instrument to be calibrated. When this requirement occurs the controllable voltage source is applying power in series with a chosen resistance value formed by the selected series of the R1–R9 resistors and it is also necessary to measure the voltage drop across the selected series of resistors. The required connections are made in the manner next described. The controllable voltage source is connected in series with a chosen series of resistors, such as R1 through R4, by closing S4. (During this sequence S3 is maintained open.) The common terminal of S2 is connected to the appropriate remote terminal of S2, S2-4 in this instance. As a result, the high output terminal of the controllable voltage source is connected in series with the chosen series of resistors (R1-R4) to the high input terminal of the measuring instrument. The low output terminals of the controllable voltage supply is directly connected to the low input terminal of the impedance measuring instrument. Consequently, a simulated ohms generation system of the type illustrated in simplified from in FIG. 1 is created. When it is desired to measure the voltage drop across the measuring instrument, S5 and S6 are closed. As a result, the input terminals of the measuring instrument are directly connected to the appropriate input terminals of the voltmeter. Alternatively, rather than S5 and S6 being closed, S5 could be closed and the common terminal of S1 connected to the same node of the series of resistors as the common terminal of S2 is connected to. In this instance, the node between R4 and R5. As a result, the input terminals of the measuring instrument are directly connected across the input terminals of the voltmeter.

In addition to measuring the voltage drop across the input terminals of the measuring instrument, during the calibration sequence it is necessary to measure the voltage drop across the series of resistors connected in series with the output of the controllable voltage source. In the exemplary case being described, this requires measuring the the voltage drop across R1 through R4. This is accomplished by maintaining S5 and S6 open, closing S3 (as well as maintaining S4 closed) and connecting the common terminal of S1 to the appropriate node. In this case, the appropriate node is the node between R4 and R5. As a result, the voltmeter is connected to measure the voltage drop across R1 through R4.

As will be readily appreciated by those skilled in the electrical measuring art, in order for the controllable voltage source to be usable in assisting in the simulation of a resistance value in the manner herein described, the output of the controllable voltage source must always be less than the voltage produced by the internal power supply of the measuring instrument. It is for this reason that the low input terminal of the voltmeter is connected through S3 to the end terminal of R1 and the high input terminal of the voltmeter is connected through S1 to the appropriate node of the series resistors. These connections result in the polarity of the voltage connected across the voltmeter being correct. Of course, if the voltmeter is an instrument that is polarity insensitive, such as a digital voltmeter, polarity condiderations do not need to be taken into account.

While R1 through R9 can be chosen to have a variety of values. Preferably, they are of ascending numerical value starting in the ohmic range and extending through the megohm range. An example of appropriate resistance values are: R1=0.9 ohms; R2=1.0 ohms; R3=17.1 ohms; R4=171 ohms; R5=1.71 Kohms; R6=17.1 Kohms; R7=171 Kohms; R8=1.71 Mohms; and, R9=17.1 Mohms.

Preferably, the controller 13 is a programmable digital controller programmed to function in the manner hereinafter described. Alternatively, of course, the controller could be formed by discrete subsystems hardwired together to function in the manner hereinafter described. That is, the controller could be formed of a set of discrete subsystems each adapted to carry out one or more of the programmed steps illustrated in the flow diagrams forming FIGS. 6A-6C and hereinafter described. In the latter case, of course, a suitable sequencer would be required to control the connection of the subsystems to the appropriate source or sources of data. Regardless of how the invention is implemented, the first step performed is determining the nature (i.e., current or voltage) of the power supply of the measuring instrument to be calibrated. Thereafter, the measuring instrument is calibrated by controlling the voltage of the output of the controllable voltage source so that it and the chosen value of resistance simulates a resistance value adapted to create a desired measuring instrument display.

Turning now to a more detailed description of the operation controller, initially the value of the resistance that the measuring instrument is to be calibrated to is entered by the operator. This resistance value is denoted in FIG. 6A as $R_0$ and may be entered via a keyboard, adjustable switches or any other suitable operator/machine interface mechanism. Alternatively, the value of $R_0$ could be automatically read by the controller from a source of resistance values stored, for example, on a digital tape, disc or other storage medium. Regardless of how produced, the controller first reads and stores the value of $R_0$. Then, the controller selects a value of resistance that can be produced by the series of resistors R1 through R9. This value is denoted $R_{f1}$. Preferably, $R_{f1}$ is chosen to be the highest resistance value that can be produced, but less than $R_0$. After this resistance value has been determined, S3 and S5 are closed and S2 is switched to connect the appropriate series resistance node to its common terminal. Then, the voltage drop across the chosen series of resistors is measured. As previously discussed, this is accomplished by positioning S1 so that its common terminal is connected to the same series resistance node as the common terminal of S2 is connected to. The resulting measured voltage drop is denoted $V_{I1}$. Next, the current flow through the chosen series of resistors, denoted $I_1$, is determined by dividing $V_{I1}$ by $R_{f1}$.

Figure 6A:
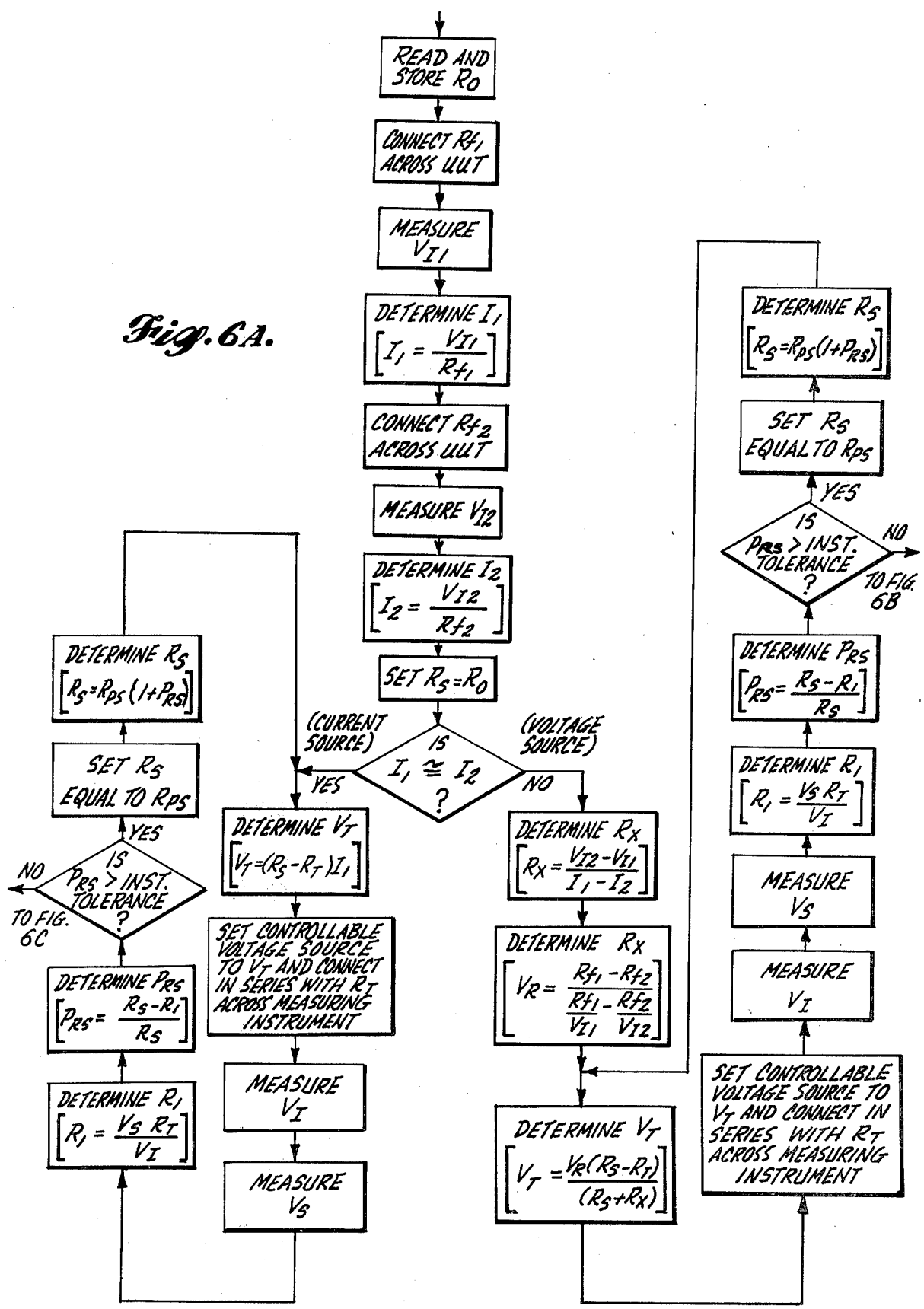

Next, a value of resistance lower than $R_{f1}$ is chosen for connection across the input of the measuring instrument. This normally means moving S2 to the next lower resistance node. The voltage drop $V_{I2}$ across the chosen value of resistance (which is denoted $R_{f2}$) is measured. After $V_{I2}$ has been measured, the value of the current flow through $R_{f2}$ is determined by dividing $V_{I2}$ by $R_{f2}$. The resultant current flow is denoted $I_2$. The next step in the sequence illustrated in FIG. 6A is clerical in nature. Specifically, a subsequently used resistance term denoted $R_S$ is set equal to $R_0$. Next, whether or not $I_1$ is equal to $I_2$ or different than $I_2$ is determined. As discussed above, if $I_1$ is substantially equal to $I_2$, the power supply of the measuring instrument is a current source. Contrariwise, if $I_1$ is not substantially equal to $I_2$, the power supply may be considered a voltage source. Depending upon whether the power supply is a current source or a voltage source, one or the other of two sequences of steps, illustrated on the left and right of FIG. 6A, respectively, are followed.

If the power supply of the measuring instrument is determined to be a voltage source, the input resistance ($R_X$—see FIG. 2) of the measuring instrument must be determined. The value of $R_X$ is determined by dividing the difference between $V_{I2}$ and $V_{I1}$ by the difference between $I_1$ and $I_2$.

The next step is to determine the actual value, $V_R$, of the voltage source of the measuring instrument. This is accomplished by dividing the difference between $R_{f1}$ and $R_{f2}$ by the difference between $R_{f1}/V_{I1}$ and $R_{f2}/V_{I2}$.

After the values of $R_X$ and $V_R$ have been determined, the value of the voltage to be reproduced by the controllable voltage source is determined. More specifically, the value of the voltage source output required to simulate a resistance equal to $R_S$, when that voltage is connected in series with a resistance designated $R_T$, is determined. Preferably, $R_T$ is the closest value to $R_0$ that can be produced, while still being greater than $R_0$. The voltage in series with $R_T$ is designated $V_T$ and is determined by multiplying $V_R$ times the difference between $R_S$ and $R_T$ and dividing the result by the combined value of $R_S$ and $R_X$.

After the value of $V_T$ has been determined, the controllable power supply is set to this value and connected in series with $R_T$ across the input terminals of the measuring instrument. This is accomplished by closing S4 and placing S2 in the correct position.

The next step is to measure the voltage drop across $R_T$ and the voltage drop across the input terminals of the measuring instrument. The first voltage drop (i.e., across $R_T$) is denoted $V_I$ and the second voltage drop is denoted $V_S$. These voltage drops are measured by connecting the voltmeter across the related series of resistors forming $R_T$ by placing S1 in the correct position and closing S3 ($V_I$) and then by opening S3 and closing S5 and S6 ($V_S$). After the values of $V_I$ and $V_S$ have been measured, the value of a first dummy resistance, denoted $R_1$, is determined. $R_1$ is determined by multiplying $V_S$ by $R_T$ and dividing the result by $V_I$.

As will be readily appreciated by those skilled in the art and others, if all of the components were perfect and all of the adjustments were precise, $R_1$ would equal $R_S$. However, this ideal situation rarely exists. Consequently, it is necessary to determine whether or not the difference between $R_1$ and $R_S$ falls within the tolerance limits of the measuring instrument. This is accomplished by determining first the value of a factor denoted $P_{RS}$. $P_{RS}$ is determined by subtracting $R_1$ from $R_S$ and dividing the difference by $R_S$. Then, $P_{RS}$ is compared with the tolerance of the measuring instrument. It $P_{RS}$ is greater than the tolerance of the measuring instrument, the previous value of $R_S$ is set equal to a factor denoted $R_{PS}$. Then, a new value of $R_S$ is determined by multiplying $R_{PS}$ times a factor equal to $1+P_{RS}$. After the new value of $R_S$ has been determined, the sequence of operation cycles back to the point where the value of $V_T$ was determined and a new value of $V_T$ is determined. The new value of $V_T$ is based on the new value of $R_S$. Thereafter, the previously described steps reoccur. This cycling continues until the value of $P_{RS}$ is determined to be less than or equal to the tolerance of the measuring instrument. When this point is reached, the sequence of operation shifts to the series of steps illustrated in FIG. 6B, which are described below.

Figure 6B:
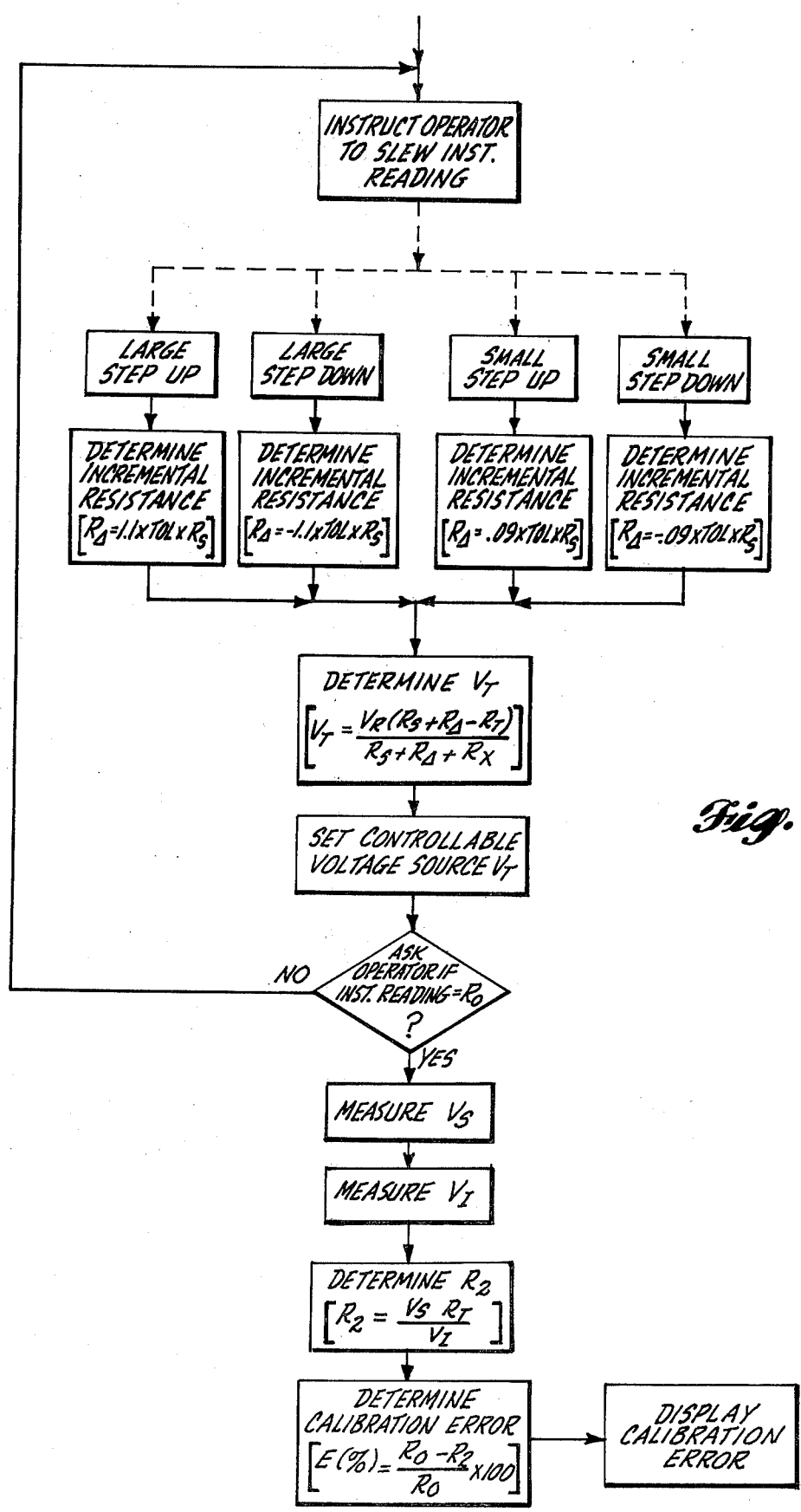

Prior to describing the sequence of steps illustrated in FIG. 6B, the sequence of steps illustrated in FIG. 6A that occur when the measuring instrument power supply is determined to be a current source power supply are described. This sequence of steps is illustrated on the left side of FIG. 6A. When the measuring instrument power supply is a current source power supply, it is unnecessary to determine the internal resistance of the power supply, or its voltage. That is, contrary to the sequence of steps illustrated on the right side of FIG. 6A, it is unnecessary to determine $R_X$ or $V_R$ values. Rather, the value of voltage ($V_T$) to be produced by the controllable power supply can be determined immediately. The value of $V_T$ is determined by determining the difference between $R_S$ and $R_T$ and multiplying that difference by $I_1$. Thereafter, the controllable power supply is set to this $V_T$ value; and, connected in series with $R_T$ across the input terminals of the measuring instrument by controlling the position of the interface switches, as previously described. Next, the voltage drop across $R_T$, denoted above as $V_I$, is measured. Then, the voltage drop across the input of the measuring instrument, denoted above as $V_S$, is measured. $V_I$ and $V_S$ are measured by placing the appropriate switches of the interface in the positions discussed above. These $V_S$ and $V_I$ measurements are used to determine the first dummy resistance $R_1$. As with the sequence of steps illustrated on the right side of FIG. 6A, which are followed when the power supply is a voltage source power supply, $R_1$ is determined by multiplying $R_T$ by $V_S$ and dividing the result by $V_I$. Next, the value of $P_{RS}$ is determined in the same manner it was previously determined (i.e., by subtracting $R_1$ $R_S$ and dividing the difference by $R_S$). Then, a determination of whether or not $P_{RS}$ is greater than the tolerance of the measuring instrument is made. If $P_{RS}$ is greater than the tolerance of the measuring instrument, as with the sequence of steps followed when the power supply is a voltage source power supply the present value of $R_S$ is set equal to a factor denoted $R_{PS}$. And, a new value of $R_S$ is determined by multiplying the value of $R_{PS}$ times a factor equal to $1+P_{RS}$. Thereafter, a new value of $V_T$ is determined using the new value of $R_S$ and the sequence of steps previously described is repeated. This sequence is repeated until the value of $P_{RS}$ becomes equal to or less than the tolerance of the measuring instrument. When this occurs, the sequence of operation shifts to the steps illustrated in FIG. 6C and hereinafter described.

At this point it will be appreciated that the voltage supply output, $V_T$, has been precisely set so that the simulated resistance value, $R_S$, formed by the combination of $R_T$ and the output of the controllable voltage source is precise. If the measuring instrument being calibrated in accurate, this simulated resistance value $R_S$ will produce an $R_0$ reading. In most instances, the measuring instrument includes some degree of error, whereby the reading is not equal to $R_0$. In this more common situation, the sequence of operation shifts to the steps illustrated in FIG. 6B or 6C, depending upon whether or not the measuring instrument power supply is a voltage source power supply or a current source power supply.

The first step in the sequence of steps illustrated in FIG. 6B is for the controller to instruct the operator to slew the measuring instrument reading. In this regard, as noted above, the operator initially entered an $R_0$ value. Hence, the operator knows the value of $R_0$. Comparing the $R_0$ value with the value displayed on the measuring instrument allows the operator to roughly determine the amount of calibration error and the polarity of the error. This rough determination of calibration error allows the operator to readily determine if the measuring instrument reading should be slewed up or down, and the size (large or small) of the slew steps. For example, if the measuring instrument reading is substantially above the value of $R_0$, a large downward slew is called for. Alternatively, if the value of the measuring instrument reading is slightly below the $R_0$ value, a small upward slew is called for. The embodiment of the invention described herein allows the operator to chose any one of these four options—large step up, large step down, small step up or small step down.

Based on his observation of the reading displayed by the measuring instrument, and his knowledge of the value of $R_0$, the operator chooses one of the four options by actuating an appropriate switch. The controller reads which of the switches is actuated by the operator and, in accordance therewith, determines the value of an incremental resistance denoted $R_\Delta$. If a large upward slew is requested, $R_\Delta$ is determined in accordance with the equation $R_\Delta = 1.1 \times TOL \times R_S$. If a large slew down is requested, $R_\Delta$ is determined in accordance with the equation $R_\Delta = -1.1 \times TOL \times R_S$. If a small slew up is requested $R_\Delta$ is determined in accordance with the equation $R_\Delta = 0.09 \times TOL \times R_S$. Finally, if a small slew down is requested $R_\Delta$ is determined in accordance with the equation $R_\Delta = -0.09 \times TOL \times R_S$. In these equations TOL is the tolerance of the measuring instrument.

Regardless of which path is followed, after the value of $R_\Delta$ is determined, a new value of $V_T$ is determined. The new value of $V_T$ is determined by multiplying $V_R$ times a factor equal to $R_S + R_\Delta - R_T$; and, then, dividing the result of this multiplication by a factor equal to $R_S + R_\Delta + R_X$. Then, the output of the controllable voltage source is set to $V_T$; and, the $V_T$ voltage is connected in series with $R_T$ across the input terminals of the measuring instrument.

The controller next asks the operator if the measuring instrument reading is equal to $R_0$. As with the instructions to the operator to slew the measuring instrument, this question can be produced on a suitable display medium, such as a seven segment light emitting diode or liquid crystal display, or a cathode ray tube display. In response to this question, the operator either indicates, via a suitable yes/no switch, that the measuring instrument reading does or does not equal $R_0$. If the measuring instrument reading does not equal $R_0$, the operator is instructed to again slew the measuring instrument reading. As before, the operator can make any of four possible choices—large step up, large step down, small step up or small step down. Based on the operator's selection, a new incremental resistance value, $R_\Delta$, is determined using the appropriate one of the formulas described above. The new incremental resistance value is summed with the previous incremental resistance value and, based thereon, a new value of $V_T$ is determined, using the equation discussed above. Thereafter, the output of the controllable voltage source is set to the new value of $V_T$ and the operator is again asked if the measuring instrument reading equals $R_0$. If not, the foregoing sequence of steps is repeated. When the measuring instrument reading is equal to the value of $R_0$ (or reaches the closest to $R_0$ that can be reached), the operator sets his switch to indicate that the measuring instrument reading equals $R_0$. When this occurs, the voltage drop across the measuring instrument input terminals, $V_S$, is measured. Then, the voltage drop across $R_T$ is measured. Based thereon, the value of a second dummy resistance, denoted $R_2$, is determined. The value of $R_2$ is determined by multiplying $V_S$ times $R_T$ and dividing the result by $V_I$. Next, the calibration error is determined. The calibration error is determined by subtracting $R_2$ from $R_0$ and dividing the result by $R_0$. The result of this division is multiplied by 100 to change the calibration error units to percent. Next, the calibration error in percent is displayed for recording by the operator. (Or the calibration error can be automatically recorded for later readout).

Figure 6C:
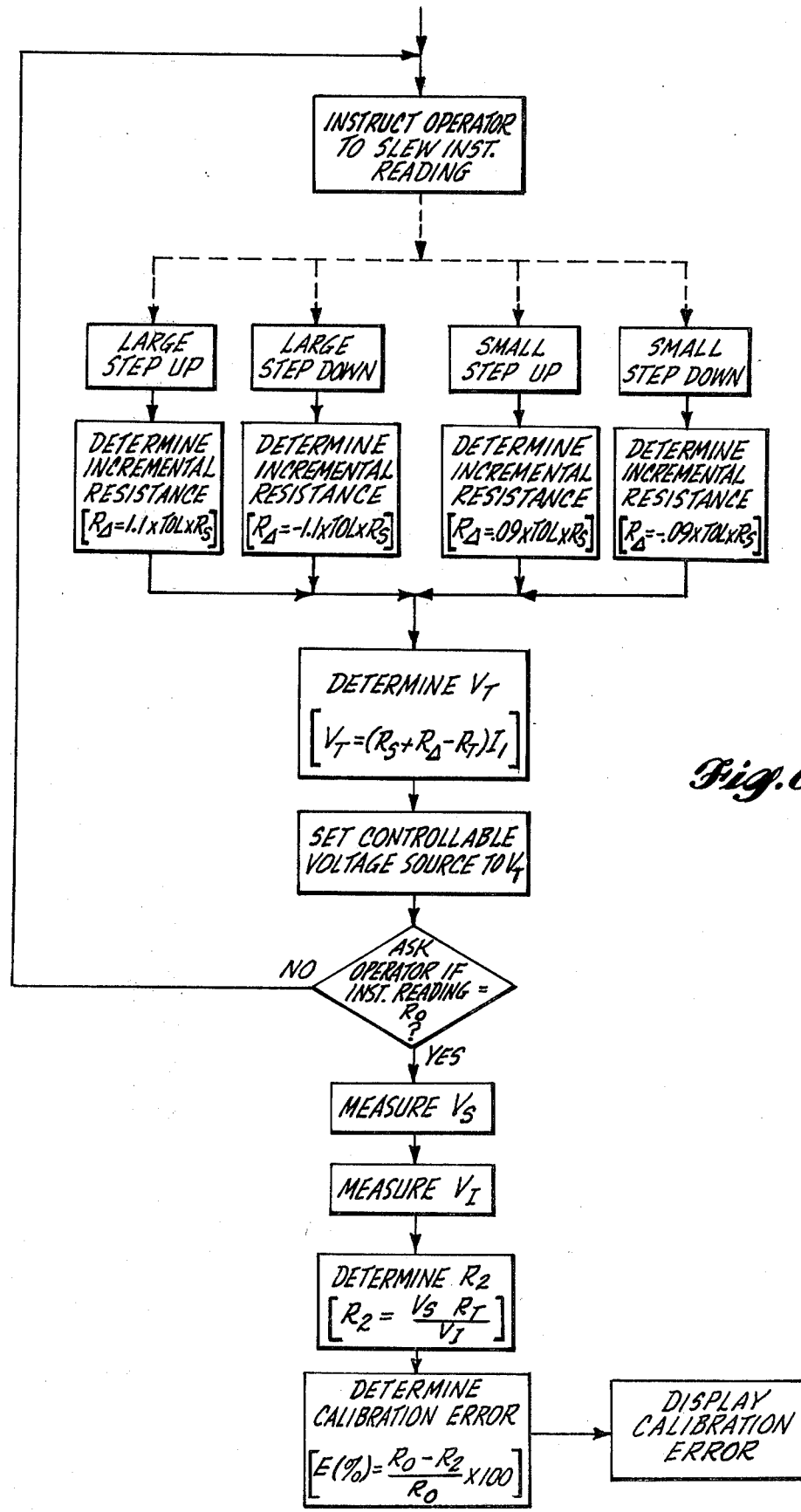

The sequence of operation of the calibration steps illustrated in FIG. 6C is substantially the same as the sequence of steps illustrated in FIG. 6B. Consequently, these steps will not be described in detail. The only difference between the two sequence of steps is how the value of $V_T$ is determined. In FIG. 6C the value of $V_T$ is determined by multiplying $I_1$ by a factor equal to $R_S + R_\Delta - R_T$.

As will be readily appreciated from the foregoing description, the invention provides a new and improved method and apparatus for calibrating resistance and conductance measuring instruments. The measuring instruments may have either current source power supplies or voltage source power supplies. The exact nature of the power supply does not need to be known by the calibrating operator, since it is automatically determined. In fact, the calibrating operator can be relatively unskilled in electronics since he only needs to be able to enter a particular value of resistance for calibration purposes; and, determine the size and polarity of the slew increments required to make the measuring instrument reading equal the entered resistance value. Relatively unskilled persons can easily carry out these uncomplicated steps. Consequently, in addition to eliminating the need for highly precise resistors, the invention allows relatively unskilled persons to calibrate resistance and conductance measuring instruments. Precision resistors are not required because the invention compensates for the inprecision of resistors connected in series with the controllable voltage source by the uncomplicated expedient of precisely controlling the output of the controllable voltage source.

While a preferred embodiment of the invention has been illustrated and described, it will be appreciated that various changes can be made therein without departing from the spirit and scope of the invention. Hence, the invention can be practiced otherwise than as specifically described herein.

The embodiments of the invention in which an exclusive property or privilege is claimed are defined as follows:

1. A simulated ohms generation method of calibrating resistance type measuring instruments comprising the steps of:
   determining the current or voltage nature of the internal power supply of the resistance type measuring instrument to be calibrated;
   adjusting the output of a voltage source connected in series with a fixed resistance so that the combination simulates a predetermined resistance value;
   applying said voltage source connected in series with said fixed resistance to the input of said resistance type measuring instrument;
   changing the value of the voltage source so that the measuring instrument reading is slewed toward the predetermined resistance value; and,
   determining the calibration error when the measuring instrument reading is the same as the predetermined resistance value.

2. The simulated ohms generation method claimed in claim 1 wherein the step of determining the current or voltage nature of the internal power supply of the measuring instrument to be calibrated comprises the substeps of:
   sequentially connecting two different resistances across the input of said resistance type measuring instrument; and,
   determining if the current flow through the two different resistances changes or is the same.

3. The simulated ohms generation method claimed in claim 2 wherein, if the current flow through the two different resistances changes, the step of adjusting the output of the voltage source connected in series with the fixed resistance so that the combination simulates a predetermined resistance value includes the substeps of:
   determining the value of the input resistance of the resistance type measuring instrument;
   determining the voltage level of the power supply of the resistance type measuring instrument;
   determining the value of the voltage to be connected in series with the fixed resistance in order for the predetermined resistance value to be simulated by said fixed resistance and said voltage source; and,
   adjusting the output of the voltage source so that the determined voltage is produced.

4. The simulated ohms generation method claimed in claim 3 wherein, if the current flow through the two different resistances remains constant, the step of adjusting the output of the voltage source connected in series with the fixed resistance so that the combination simulates a predetermined resistance value includes the substeps of:
   determining the value of the voltage to be connected in series with the fixed resistance in order for the predetermined resistance value to be simulated by said fixed resistance and said source; and,
   adjusting the output of the voltage source so that the determined voltage value is produced.

5. The simulated ohms generation method claimed in claim 4, wherein the step of adjusting the output of the voltage source connected in series with the fixed resistance so that the combination simulates a predetermined resistance value also includes the substeps of:
   measuring the voltage drop across the input of the resistance type measuring instrument;
   measuring the voltage drop across the fixed resistance;
   determining the value of a first dummy resistance based on the measured values of the voltage drop across the input of the measuring instrument, the voltage drop across the fixed resistance and the value of the fixed resistance;
   comparing the value of the first dummy resistance to the redetermined resistance to determine if the error therebetween is greater or less than the tolerance of the resistance type measuring instrument;
   if the error is greater than the tolerance of the resistance type measuring instruments, redetermining the value of the resistance to be simulated;
   adjusting the voltage source so that the output of the voltage source and the fixed resistance simulate said redetermined value; and,
   repeating the foregoing sequence of operation until the error between the first dummy resistance value and the redetermined resistance value is less than or equal to the tolerance of the measuring instrument to be calibrated.

6. The simulated ohms generation method claimed in claim 5 wherein the step of changing the value of the voltage source so that the measuring instrument reading is slewed toward the predetermined resistance value comprises the steps of sequentially changing the value of the voltage source in large or small steps, upwardly or downwardly, as required, until the reading of the resistance type measuring instrument is equal to the predetermined resistance value.

7. The simulated ohms generation method claimed in claim 6, wherein the step of determining the calibration error when the resistance type measuring instrument reading is the same as the predetermined resistance value comprises the substeps of:
   measuring the voltage drop across the input of the resistance type measuring instrument;
   measuring the voltage drop across the fixed resistance;
   determining the value of a second dummy resistance based on the measured values of the voltage drop across the input of the measuring instrument, the voltage drop across the fixed resistance and the value of the fixed resistance; and,
   determining the error between the second dummy resistance and the predetermined resistance, said error forming said calibration error.

8. The simulated ohms generation method claimed in claim 3, wherein the step of adjusting the output of the voltage source connected in series with the fixed resistance so that the combination simulates a predetermined resistance value also includes the substeps of:
   measuring the voltage drop across the input of the resistance type measuring instrument;
   measuring the voltage drop across the fixed resistance;

determining the value of a first dummy resistance based on the measured values of the voltage drop across the input of the measuring instrument, the voltage drop across the fixed resistance and the value of the fixed resistance;

comparing the value of the first dummy resistance to the predetermined resistance to determine if the error therebetween is greater or less than the tolerance of the resistance type measuring instrument;

if the error is greater than the tolerance of the resistance type measuring instruments, redetermining the value of the resistance to be simulated;

adjusting the voltage source so that the output of the voltage source and the fixed resistance simulate said redetermined value; and, repeating the foregoing sequence of operation until the error between the first dummy resistance value and the redetermined resistance value is less than or equal to the tolerance of the measuring instrument to be calibrated.

9. The simulated ohms generation method claimed in claim 8 wherein the step of changing the value of the voltage source so that the measuring instrument reading is slewed toward the predetermined resistance value comprises the steps of sequentially changing the value of the voltage source in large or small steps, upwardly or downwardly, as required, until the reading of the resistance type measuring instrument is equal to the predetermined resistance value.

10. The simulated ohms generation method claimed in claim 9, wherein the step of determining the calibration error when the resistance type measuring instrument reading is the same as the predetermined resistance value comprises the substeps of:

measuring the voltage drop across the input of the resistance type measuring instrument;

measuring the voltage drop across the fixed resistance;

determining the value of a second dummy resistance based on the measured values of the voltage drop across the input of the measuring instrument, the voltage drop across the fixed resistance and the value of the fixed resistance; and, determining the error between the second dummy resistance and the predetermined resistance, said error forming said calibration error.

11. The simulated ohms generation method claimed in claim 2 wherein, if the current flow through the two different resistances remains constant, the step of adjusting the output of the voltage source connected in series with the fixed resistance so that the combination simulates a predetermined resistance value includes the substeps of:

determining the value of the voltage to be connected in series with the fixed resistance in order for the predetermined resistance value to be simulated by said fixed resistance and said source; and, adjusting the output of the voltage source so that the determined voltage value is produced.

12. The simulated ohms generation method claimed in claim 11, wherein the step of adjusting the output of the voltage source connected in series with the fixed resistance so that the combination simulates a predetermined resistance value also includes the substeps of:

measuring the voltage drop across the input of the resistance type measuring instrument;

measuring the voltage drop across the fixed resistance;

determining the value of a first dummy resistance based on the measured values of the voltage drop across the input of the measuring instrument, the voltage drop across the fixed resistance and the value of the fixed resistance;

comparing the value of the first dummy resistance to the predetermined resistance to determine if the error therebetween is greater or less than the tolerance of the resistance type measuring instrument;

if the error is greater than the tolerance of the resistance type measuring instruments, redetermining the value of the resistance to be simulated;

adjusting the voltage source so that the output of the voltage source and the fixed resistance simulate said redetermined value; and, repeating the foregoing sequence of operation until the error between the first dummy resistance value and the redetermined resistance value is less than or equal to the tolerance of the measuring instrument to be calibrated.

13. The simulated ohms generation method claimed in claim 12 wherein the step of changing the value of the voltage source so that the measuring instrument reading is slewed toward the predetermined resistance value comprises the steps of sequentially changing the value of the voltage source in large or small steps, upwardly or downwardly, as required, until the reading of the resistance type measuring instrument is equal to the predetermined resistance value.

14. The simulated ohms generation method claimed in claim 13, wherein the step of determining the calibration error when the resistance type measuring instrument reading is the same as the predetermined resistance value comprises the substeps of:

measuring the voltage drop across the input of the resistance type measuring instrument;

measuring the voltage drop across the fixed resistance;

determine the value of a second dummy resistance based on the measured values of the voltage drop across the input of the measuring instrument, the voltage drop across the fixed resistance and the value of the fixed resistance; and, determining the error between the second dummy resistance and the predetermined resistance, said error forming said calibration error.

15. The simulated ohms generation method claimed in claim 1 wherein the step of changing the value of the voltage source so that the measuring instrument reading is slewed toward the predetermined resistance value comprises the steps of sequentially changing the value of the voltage source in large or small steps, upwardly or downwardly, as required, until the reading of the resistance type measuring instrument is equal to the initial predetermined resistance value.

16. The simulated ohms generation method claimed in claim 15, wherein the step of determining the calibration error when the resistance type measuring instrument reading is the same as the predetermined resistance value comprises the substeps of:

measuring the voltage drop across the input of the resistance type measuring instrument;

measuring the voltage drop across the fixed resistance;

determine the value of a dummy resistance based on the measured values of the voltage drop across the input of the measuring instrument, the voltage drop across the fixed resistance and the value of the fixed resistance; and, determining the error between the dummy resistance and the predetermined resistance, said error forming said calibration error.

17. The simulated ohms generation method claimed in claim 1, wherein the step of determining the calibration error when the resistance type measuring instrument reading is the same as the predetermined resistance value comprises the substeps of:

measuring the voltage drop across the input of the resistance type measuring instrument;

measuring the voltage drop across the fixed resistance;

determining the value of a dummy resistance based on the measured values of the voltage drop across the input of the measuring instrument, the voltage drop across the fixed resistance and the value of the fixed resistance; and, determining the error between the dummy resistance and the predetermined resistance, said error forming said calibration error.

18. A simulated ohms generation apparatus for calibrating resistance type measuring instruments comprising:

(A) a voltage measuring instrument suitable for measuring a voltage and producing an output representative of the measured voltage;

(B) a controllable voltage source suitable for producing an output voltage having a magnitude determined by the nature of a control signal applied to said controllable voltage source by a controller;

(C) an interface for connecting said voltage measuring instrument and said controllable voltage source to a resistance type measuring instrument to be calibrated, said interface including resistance means and switch means for: (i) selectively connecting said resistance means and the output of said controllable voltage source across the input of said resistance type measuring instrument to be calibrated; and, (ii) selectively connecting said voltage measuring instrument across said resistance means and the input of said resistance type measuring instrument to be calibrated in accordance with control signals produced by a controller; and, (D) a controller connected to: (i) said voltage measuring instrument for receiving the outputs produced by said voltage measuring instrument that represent voltages measured by said voltage measuring instrument; (ii) said controllable voltage source for controlling the magnitude of the voltage produced by said controllable voltage source; and, (iii) said interface for controlling said switch means, said controller including means for determining the calibration error of said resistance type measuring instrument by:

(1) controlling said switch means so that the output of said controllable voltage source is connected in series with a known resistance produced by said resistance means;

(2) controlling the output of said controllable voltage source so that the combination of the output of said controllable voltage source and said known resistance simulates a predetermined resistance value;

(3) applying said simulated resistance value to the input of said resistance type measuring instrument to be calibrated;

(4) changing the output of said controllable voltage source until the reading of said resistance type measuring instrument to be calibrated is equal to said simulated predetermined resistance value; and, (5) determining the calibration error when the measuring instrument reading is the same as the predetermined resistance value based on the predetermined resistance value and the resistance value being simulated when the measuring instrument reading is the same as the predetermined resistance value.

19. The simulated ohms generation apparatus claimed in claim 18 wherein said controller determines said calibration error by:

controlling said interface so that said voltage measuring instrument measures the voltage drops across the input of said resistance type measuring instrument and across said known resistance produced by said resistance means;

determining the value of a dummy resistance based on the measured values of the voltage drop across the input of the resistance type measuring instrument, the voltage drop across the known resistance produced by said resistance means and the value of said known resistance produced by said resistance means; and, determining the error between the dummy resistance and the simulated predetermined resistance value, said error forming said calibration error.

20. The simulated ohms generation apparatus claimed in claim 19 wherein said controller determines the current or voltage nature of the internal power supply of a resistance type measuring instrument to be calibrated by sequentially causing said switch means to sequentially connect two different resistances produced by said resistance means to the input of said resistance type measuring instrument and determining if the current flow through said two different resistances changes or remains constant.

21. The simulated ohms generation apparatus claimed in claim 20 wherein said resistance means of said interface comprises a series of resistors.

22. The simulated ohms generation apparatus claimed in claim 21 wherein said series of resistors are connected in series in numerical ascending order based on their resistance values and said switch means are connected to the nodes between the resistors.

23. The simulated ohms generation apparatus claimed in claim 18 wherein said controller determines the current or voltage nature of the internal power supply of a resistance type measuring instrument to be calibrated by sequentially causing said switch means to sequentially connect two different resistances produced by said resistance means to the input of said resistance type measuring instrument and determining if the current flow through said two different resistances changes or remains constant.

24. The simulated ohms generation apparatus claimed in claim 18 wherein said resistance means of said interface comprises a series of resistors.

25. The simulated ohms generation apparatus claimed in claim 24 wherein said series of resistors are connected in series in numerical ascending order based on their resistance values and said switch means are connected to the nodes between the resistors.

* * * * *

UNITED STATES PATENT AND TRADEMARK OFFICE
CERTIFICATE OF CORRECTION

PATENT NO. : 4,335,349
DATED : June 15, 1982
INVENTOR(S) : Baldock, et al.

It is certified that error appears in the above-identified patent and that said Letters Patent are hereby corrected as shown below:

| | | |
|---|---|---|
| Column 3, | line 42: | "supple" is changed to --supply-- |
| Column 7, | line 3: | "resistence" is changed to --resistance-- |
| | line 68: | delete "the" (either occurrence) |
| Column 8, | line 25: | "valves. Preferably," should be --valves, preferably-- |
| | lines 22 & 23: | "condiderations" should be --considerations-- |
| Column 10, | line 13: | "It" should be --If-- |
| Column 11, | line 14: | "in" should be --is-- |
| | line 41: | "chose" should be --choose-- |
| Column 12, | line 41: | "readout)." should be --readout.)-- |
| Column 16, | line 39: | "determine" should be --determining-- |
| | line 66: | "determine" should be --determining-- |

Signed and Sealed this

Thirty-first Day of August 1982

[SEAL]

Attest:

GERALD J. MOSSINGHOFF

Attesting Officer     Commissioner of Patents and Trademarks